(12) United States Patent
Yokoyama et al.

(10) Patent No.: US 8,081,669 B2
(45) Date of Patent: Dec. 20, 2011

(54) METHOD OF DRIVING LASER DIODE DEVICE AND LASER DIODE EQUIPMENT

(75) Inventors: Hiroyuki Yokoyama, Miyagi (JP); Shunsuke Kono, Miyagi (JP); Tomoyuki Oki, Kanagawa (JP); Masao Ikeda, Kanagawa (JP)

(73) Assignees: Sony Corporation, Tokyo (JP); Tohoku University, Miyagi (JP)

( * ) Notice: Subject to any disclaimer, the term of this patent is extended or adjusted under 35 U.S.C. 154(b) by 0 days.

(21) Appl. No.: 12/710,934

(22) Filed: Feb. 23, 2010

(65) Prior Publication Data

US 2010/0220754 A1 Sep. 2, 2010

(30) Foreign Application Priority Data

Mar. 2, 2009 (JP) ................ 2009-047617

(51) Int. Cl.
*H01S 3/10* (2006.01)
*H01S 3/091* (2006.01)
*H01S 3/094* (2006.01)
(52) U.S. Cl. .......................... 372/25; 372/70
(58) Field of Classification Search ............ 372/25, 372/70
See application file for complete search history.

(56) References Cited

U.S. PATENT DOCUMENTS 3,953,809 A * 4/1976 Kawamoto et al. ............ 372/26
5,541,947 A * 7/1996 Mourou et al. ................ 372/25

OTHER PUBLICATIONS

Jun Ohya et al.; Generation of Picosecond Blue Light Pulse by Frequency Doubling of a Gain-Switched GaAlAs Laser Diode having Saturable Absorber; IEEAE Journal of Quantum Electronics, vol. 27, 2050; 1991.
J.E. Ripper and J.C. Dyment; Internal Q Switching in GaAs Junction Lasers; Applied Physics Letters; vol. 12, No. 11; Jun. 1, 1968.
John Auyeung; Picosecond Optical Pulse Generation at Gigahertz Rates by Direct Modulation of a Semiconductor Laser; Applied Physics Letters; vol. 38, No. 5; Mar. 1, 1981.
N. Yamada and Y. Nakagawa; Pulse Shaping Using Spectral Filtering in Gain-switched Quantum Well Laser Diodes; Applied Physics letters; vol. 63, No. 583; 1993.
Peter Vasil'ev; Ultrafast Diode Lasers: Fundamentals and Applications; Artech House; 1995.

* cited by examiner

*Primary Examiner* — Patrick Stafford
(74) *Attorney, Agent, or Firm* — SNR Denton US LLP

(57) ABSTRACT

A method of driving an ultrashort pulse and ultrahigh power laser diode device having a simple composition and a simple structure is provided. In the method of driving a laser diode device, light is injected from a light injection means into a laser diode device driven by a pulse current having a value 10 or more times as large as a value of a threshold current.

14 Claims, 15 Drawing Sheets

METHOD OF DRIVING LASER DIODE DEVICE AND LASER DIODE EQUIPMENT

BACKGROUND OF THE INVENTION

1. Field of the Invention

The present invention relates to a method of driving a laser diode device and a laser diode equipment.

2. Description of the Related Art

In these years, in the advanced scientific region researches using laser light with the pulse time on the attosecond time scale or on the femtosecond time scale, ultrashort pulse and ultrahigh power laser is actively used. As the ultrashort pulse and ultrahigh power laser, for example, titanium/sapphire laser is known. Such a titanium/sapphire laser is an expensive and large solid laser light source, which is a main factor to inhibit spread of the technology. If the ultrashort pulse and ultrahigh power laser is realized with the use of a laser diode device, substantial miniaturization, price reduction, and high stability are able to be realized.

Meanwhile, short pulsation of the laser diode device has been actively researched since 1960s in the communication system field. As a method of generating short pulses in the laser diode device, gain switching method, loss switching method (Q switching method), and mode locking method are known. In these methods, high output is pursued by combining the laser diode device with a diode amplifier, a nonlinear optical device, an optical fiber and the like.

SUMMARY OF THE INVENTION

Of the foregoing methods, in the gain switching method as the simplest method, by driving the laser diode device by a short pulse current, a light pulse having a pulse width of about from 20 picosecond to 100 picosecond both inclusive is able to be generated (for example, refer to J. Ohya et al., Appl. Phys. Lett. 56 (1990) 56. as Nonpatent document 1, J. AuYeung et al., Appl. Phys. Lett. 38 (1981) 308. as Nonpatent document 2, N. Yamada et al., Appl. Phys. Lett. 63 (1993) 583. as Nonpatent document 3, J. E. Ripper et al., Appl. Phys. Lett. 12 (1968) 365. as Nonpatent document 4, and "Ultrafast diode lasers," P. Vasil'ev, Artech House inc., 1995 as Nonpatent document 5). In the gain switching method, since a commercially available laser diode device is just driven by a short pulse current, a picosecond class short pulse light source is able to be realized by a significantly simple equipment structure. However, the peak output of the light pulse is about from 0.1 watt to 1 watt both inclusive in a 850 nm band AlGaAs laser diode device, and is about from 10 milliwatt to 100 milliwatt both inclusive in a 1.5 nm band InGaAsP laser diode device. Thus, as a light source necessary for a high peak output used for, for example, two-photon absorption, the light output is not sufficient. Therefore, in order to increase the peak output, for example, a complicated and difficult structure in which, for example, mode locking method is combined with a diode amplifier or an optical fiber amplifier is necessitated.

Examples of methods of increasing light peak power in the gain switching method include a method of increasing intensity of an electric short pulse for excitation. However, in such a method, there is a disadvantage that not only intensity of main light peak but also intensity of the second light peak, the third light peak and the like as a surplus component is also increased.

Further, regarding an example that a high output is pursued based on "all semiconductor" as an essential requirement for realizing ultimate miniaturization, that is, regarding a laser diode equipment that does not need complicated mechanical parts or optical parts but is composed of only a laser diode device or a combination of a laser diode device and a semiconductor device, almost no report exists particularly in a 405 nm band laser diode device composed of GaN compound semiconductor. However, if "all semiconductor" pulse laser having a high peak output is able to be realized in 405 nm band, such a pulse laser is able to be used as a light source of a stacked volumetric optical disc system expected as a next generation optical disc system after the Blu-ray optical disc system. In addition, a simple and convenient ultrashort pulse and ultrahigh power light source covering all wavelength bands in the visible light range is able to be realized, and a light source requested in the medical field, the bio imaging field and the like is able to be provided.

Accordingly, in the invention, it is desirable to provide a method of driving an ultrashort pulse and ultrahigh power laser diode device having a simple composition and a simple structure and a laser diode equipment mounting such a laser diode device.

According to a first aspect of the invention to attain the foregoing object, there is provided a method of driving a laser diode device, wherein light is injected from a light injection means into a laser diode device driven by a pulse current having a value 10 or more times as large as a value of a threshold current, preferably 20 or more times as large as the value of the threshold current, and more preferably 50 or more times as large as the value of the threshold current.

Where a value of a threshold current $I_{th}$ represents a current flown to the laser diode device when laser oscillation is started, a value of a threshold voltage $V_{th}$ described next represents a voltage applied to the laser diode device at that time, and an internal resistance of the laser diode device is R (Ω), the following relation exists:

$$V_{th}=R*I_{th}+V_0$$

In this case, $V_0$ represents a built-in potential of p-n junction.

According to a second aspect of the invention to attain the foregoing object, there is provided a method of driving a laser diode device, wherein light is injected from a light injection means into a laser diode device driven by a pulse voltage having a value twice or more as large as a value of a threshold voltage, preferably 4 or more times as large as the value of the threshold voltage, and more preferably 10 or more times as large as the value of the threshold voltage.

According to the first aspect of the invention to attain the foregoing object, there is provided a laser diode equipment including A: a laser diode device driven by a pulse current having a value 10 or more times as large as a value of a threshold current, preferably 20 or more times as large as the value of the threshold current, and more preferably 50 or more times as large as the value of the threshold current; and B: a light injection means for injecting light into the laser diode device.

According to the second aspect of the invention to attain the foregoing object, there is provided a laser diode equipment including A: a laser diode device driven by a pulse voltage having a value twice or more as large as a value of a threshold voltage, preferably 4 or more times as large as the value of the threshold voltage, and more preferably 10 or more times as large as the value of the threshold voltage; and B: a light injection means for injecting light into the laser diode device.

According to a third aspect of the invention to attain the foregoing object, there is provided a laser diode equipment including A: a laser diode device that outputs a first light peak in which a light intensity is 3 watt or more, preferably 5 watt or more, and more preferably 10 watt or more, and a half bandwidth is 20 picosecond or less, preferably 15 picosecond or less, and more preferably 10 picosecond or less, and outputs a second light peak in which energy is 1 nano Joule or more, preferably 2 nano Joule or more, and more preferably 5 nano Joule or more, and duration time is 1 nanosecond or more, preferably 2 nanosecond or more, and more preferably 5 nanosecond or more following the first light peak; and B: a light injection means for injecting light into the laser diode.

In the laser diode equipment according to the third aspect of the invention (hereinafter referred to as "third aspect of the invention" in some cases), The lower limit value of the half bandwidth of the first light peak depends on characteristics and specifications of the laser diode device, specifications of a pulse generator and the like. The upper limit value of the duration time of the second light peak is restricted by an average output in relation to repetition frequency. For example, in the case where the repetition frequency is 100 MHz, 10 nanosecond (duty ratio: 10%) is able to be exemplified.

In the method of driving a laser diode device according to the first aspect or the second aspect of the invention, light is injected from the light injection means into the laser diode device driven under the specific conditions (that is, a laser diode device performing strong excitation gain switching operation). Further, the laser diode equipments according to the first to the third aspects of the invention are composed of the laser diode device driven under the specific conditions (that is, a laser diode device performing strong excitation gain switching operation) and the light injection means for injecting light into the laser diode device. As described above, by injecting light from the light injection means into the laser diode device, that is, by injecting light from the external light injection means into the laser diode device performing gain switching operation, oscillation wavelength of the laser diode device is drawn into the oscillation wavelength of injected light, and peak power of the laser light outputted from the laser diode device is able to be intensified. Accordingly, a laser light source having kilowatt level peak light intensity is able to be obtained without pursuing high development of electric drive electronics. Further, for example, a light peak output necessary for a stacked volumetric optical disc system is able to be sufficiently satisfied, and it is significantly useful as a light source of the next generation stacked volumetric optical disc system.

In the first aspect of the invention, the laser diode device is driven by the pulse current having a value 10 or more times as large as the value of the threshold current $I_{th}$. In the second aspect of the invention, the laser diode device is driven by the pulse voltage having a value twice or more times as large as the value of the threshold voltage $V_{th}$. In result, an ultrashort pulse and ultrahigh power laser diode equipment that outputs laser light having a pointed peak in which the light intensity is 3 watt or more, and the half bandwidth is 20 picosecond or less is able to be provided. Further, in the third aspect of the invention, an ultrashort pulse and ultrahigh power laser diode equipment that outputs laser light having a pointed peak in which the light intensity is 3 watt or more, and the half bandwidth is 20 picosecond or less as the first light peak, and outputs the second light peak in which energy is 1 nano Joule or more, and the duration time is 1 nanosecond or more as a broad peak having high energy following the first light peak is able to be provided. That is, a light pulse having a high peak power and having high energy per 1 light pulse is able to be generated. Accordingly, with the use of simple combination of a commercially available high output laser diode device and electric drive electronics, a laser diode device light source having peak light intensity of watt level or more is easily able to be obtained.

Furthermore, in the case where light intensity of injected light by the light injection means is changed, ultrashort and high output pulse laser light outputted from the laser diode equipment is able to be modified, and increase amount of peak power of the pulse laser light is able to be changed.

Other and further objects, features and advantages of the invention will appear more fully from the following description.

BRIEF DESCRIPTION OF THE DRAWINGS

FIG. 5A is a graph obtained in a state that light injection is made, and FIG. 5B is a graph obtained in a state that light injection is not made. FIGS. 5A and 5B are graphs illustrating time change of a light waveform in all spectrum components.

FIG. 6A is a graph obtained in a state that light injection is made, and FIG. 6B is a graph obtained in a state that light injection is not made. FIGS. 6A and 6B are graphs illustrating all light spectrum.

FIG. 7A is a graph obtained in a state that light injection is made, and FIG. 7B is a graph obtained in a state that light injection is not made. FIGS. 7A and 7B are graphs illustrating time change of a light waveform in the spectrum component obtained by extracting a wavelength component in the vicinity of the wavelength $\lambda_2$ of light from a light injection means by using a band pass filter.

FIG. 8A is a graph obtained in a state that light injection is made, and FIG. 8B is a graph obtained in a state that light injection is not made. FIGS. 8A and 8B are graphs illustrating light spectrum obtained by extracting a wavelength component in the vicinity of the wavelength $\lambda_2$ of light from the light injection means by using the band pass filter.

FIG. 9A is a graph obtained in a state that light injection is made, and FIG. 9B is a graph obtained in a state that light injection is not made. FIGS. 9A and 9B are graphs illustrating time change of a light waveform in the spectrum component obtained by extracting a wavelength component in the vicinity of the wavelength $\lambda_1$ (wavelength of the first light peak outputted from the laser diode device in a state that light is not injected from the light injection means) by using a band pass filter.

FIG. 10A is a graph obtained in a state that light injection is made, and FIG. 10B is a graph obtained in a state that light injection is not made. FIGS. 10A and 10B are graphs illustrating light spectrum obtained by extracting a wavelength component in the vicinity of the wavelength $\lambda_1$ by using the band pass filter.

FIG. 12A is a graph obtained in a state that light injection is made, and FIG. 12B is a graph obtained in a state that light injection is not made. FIGS. 12A and 12B are graphs illustrating time change of a light waveform in all spectrum components.

FIG. 13A is a graph obtained in a state that light injection is made, and FIG. 13B is a graph obtained in a state that light injection is not made. FIGS. 13A and 13B are graphs illustrating all light spectrum.

DETAILED DESCRIPTION OF THE PREFERRED EMBODIMENT

Figure 1A:
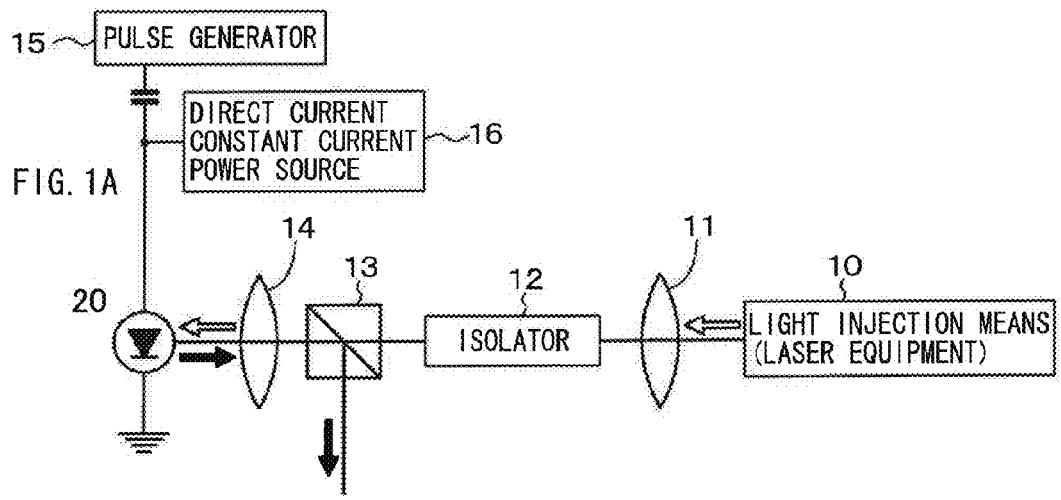
FIGS. 1A and 1B are circuit diagrams of a laser diode equipment of a first embodiment.

While the invention will be hereinafter described based on embodiments with reference to the drawings, the invention is not limited to the embodiments, and various numerical values and materials in the embodiments are exemplification. The description will be given in the following order:
1. Method of driving a laser diode device according to a first aspect and a second aspect of the invention, a laser diode equipment according to the first aspect to a third aspect of the invention, and overall description
2. First embodiment (the method of driving a laser diode device according to the first aspect and the second aspect of the invention and the laser diode equipment according to the first aspect to the third aspect of the invention)
3. Second embodiment (modification of the first embodiment and others)

The method of driving a laser diode device according to the first aspect and the second aspect of the invention, the laser diode equipment according to the first aspect to the third aspect of the invention, and overall description In the method of driving a laser diode device according to the first aspect of the invention or the laser diode equipment according to the first aspect of the invention (hereinafter generically referred to as "first aspect of the invention" in some cases), the width of a pulse current may be 10 nanosecond or less, and preferably 2 nanosecond or less. Further, in the first aspect of the invention including such a preferred form, the value of the pulse current may be 0.4 ampere or more, and preferably 0.8 ampere or more. Otherwise, in the case where the value of the pulse current is converted to a value per 1 $cm^2$ of an active layer (per 1 $cm^2$ of a joint region area), that is, in the case where the value of the pulse current is converted to a current density (operation current density, unit: ampere/$cm^2$), the value may be $3.5*10^4$ ampere/$cm^2$ or more, and preferably $7*10^4$ ampere/$cm^2$ or more. The lower limit value of the width of the pulse current depends on specifications and the like of a pulse generator. The upper limit of the value of the pulse current may be determined based on specifications of a laser diode device to be used.

In the method of driving a laser diode device according to the second aspect of the invention or the laser diode equipment according to the second aspect of the invention (hereinafter generically referred to as "second aspect of the invention" in some cases), the width of a pulse voltage may be 10 nanosecond or less, and preferably 2 nanosecond or less. Further, in the second aspect of the invention including such a preferred form, the value of the pulse voltage may be 8 volt or more, and preferably 16 volt or more if measurement is made in 50Ω system. The lower limit value of the width of the pulse voltage depends on specifications and the like of a pulse generator. The upper limit of the value of the pulse voltage may be determined based on specifications of a laser diode device to be used.

In the first aspect of the invention or the second aspect of the invention including the various preferred forms described above, where in a state that light is not injected from a light injection means, a wavelength of main light outputted from the laser diode device (peak wavelength of oscillation wavelength in a total time waveform) is $\lambda_3$, and a wavelength of light from the light injection means is $\lambda_2$, the following formulas are effected:

$$0.98 \leq \lambda_2/\lambda_3 \leq 1.02, \text{ or preferably } 0.99 \leq \lambda_2/\lambda_3 \leq 1.01$$

Further, in the first aspect of the invention or the second aspect of the invention including the various preferred forms and compositions described above, the light injection means may be composed of a laser equipment, or the light injection means may be composed of an external resonator, specifically, for example, may be composed of an external mirror that reflects laser light outputted from the laser diode device to the laser diode device (returns laser light outputted from the laser diode device back to the laser diode device). In the former case, the laser equipment may be a continuous oscillation type laser equipment. In this case, the laser diode device may be driven under the foregoing conditions in a state that light is injected into the laser diode device by the laser equipment (that is, in a state that light is irradiated). Otherwise, in the former case, the laser equipment may be a pulse oscillation type laser equipment. In this case, the laser diode device may be driven under the foregoing conditions in a state that light is injected into the laser diode device by the laser equipment, or immediately after light injection (for example, within subnanosecond after light injection). Further, in the latter case, where a beat frequency of the external resonator (for example, the external mirror) is $f_2$, and a repetition frequency of a pulse voltage or a pulse current applied to the laser diode device is $f_1$, the following formulas are effected:

$$0.99 \leq f_2/f_1 \leq 1.01, \text{ or preferably } 0.995 \leq f_2/f_1 \leq 1.005$$

The beat frequency $f_2$ is a beat at which light reciprocates in the external resonator, and is obtained by formula $f_2=2L/c$ where a resonator length is L and light velocity is c.

In the first aspect of the invention, the second aspect of the invention, or the third aspect of the invention including the various preferred forms described above (hereinafter generically and simply referred to as "the invention" in some cases), the laser diode device may be a laser diode device having a ridge stripe type separate confinement heterostructure (SCH structure). A ridge section is able to be formed by removing part of a second compound semiconductor layer described later in the thickness direction by, for example, RIE method.

In the invention including the foregoing preferred forms, the laser diode device may include a laminated structure composed of a first compound semiconductor layer, the active layer having a quantum well structure, and the second compound semiconductor layer; a first electrode electrically connected to the first compound semiconductor layer; and a second electrode electrically connected to the second compound semiconductor layer. The laminated structure may be composed of AlGaInN compound semiconductor. That is, the laminated structure may be a GaN laser diode device.

Specific examples of AlGaInN compound semiconductor include GaN, AlGaN, GaInN, and AlGaInN. Further, such a compound semiconductor may include boron (B) atom, thallium (Tl) atom, arsenic (As) atom, phosphorus (P) atom, or antimony (Sb) atom according to needs. Further, the active layer having the quantum well structure has a structure in which at least one well layer and at least one barrier layer are layered. As a combination of compound semiconductor composing the well layer and compound semiconductor composing the barrier layer, ($In_yGa_{(1-y)}N$, GaN), ($In_yGa_{(1-y)}N$, $In_zGa_{(1-z)}N$) (y>z), and ($In_yGa_{(1-y)}N$, AlGaN) are able to be exemplified. In some cases, AlGaInN compound semiconductor composing the laminated structure of the laser diode device is hereinafter referred to as "GaN compound semiconductor." In some cases, the AlGaInN compound semiconductor layer is hereinafter referred to as "GaN compound semiconductor layer."

Further, in the foregoing preferred composition, the second compound semiconductor layer may have a superlattice structure in which a p-type GaN layer and a p-type AlGaN layer are alternately layered. The thickness of the superlattice structure may be 0.7 µm or less. By adopting such a superlattice structure, while a high refractive index necessary as a cladding layer is maintained, a series resistance component of the laser diode device is able to be decreased, leading to realizing a low operation voltage of the laser diode device. The lower limit value of the thickness of the superlattice structure is not limited, but the lower limit value is, for example, 0.3 µm. As the thickness of the p-type GaN layer composing the superlattice structure, a thickness from 1 nm to 5 nm both inclusive is able to be exemplified. As the thickness of the p-type AlGaN layer composing the superlattice structure, a thickness from 1 nm to 5 nm both inclusive is able to be exemplified. As the total number of layers of the p-type GaN layer and the p-type AlGaN layer, the number from 60 to 300 both inclusive is able to be exemplified. Further, the second electrode may be provided on the second compound semiconductor layer. The distance from the active layer to the second electrode may be 1 µm or less, and preferably 0.6 µm or less. By defining the distance from the active layer to the second electrode, the thickness of the p-type second compound semiconductor layer having high resistance is able to be decreased, and the operation voltage of the laser diode device is able to be decreased. Though the lower limit value of the distance from the active layer to the second electrode is not limited, and for example, the lower limit value of the distance from the active layer to the second electrode is 0.3 µm. Further, the second compound semiconductor layer may be doped with Mg at the level of $1*10^{19}$ cm$^{-3}$ or more. The absorption coefficient of the second compound semiconductor layer to light in 405 nm wavelength from the active layer may be at least 50 cm$^{-1}$. The atom concentration of Mg comes from material physicality that the maximum electron hole concentration is shown at the value of $2*10^{19}$ cm$^{-3}$, and a result of design that the maximum electron hole concentration, that is, the specific resistance of the second compound semiconductor layer becomes the minimum. The absorption coefficient of the second compound semiconductor layer is defined in view of decreasing resistance of the laser diode device as much as possible. In result, in general, the absorption coefficient of light of the active layer becomes 50 cm$^{-1}$. However, it is possible that the Mg dope amount is intentionally set to the concentration of $2*10^{19}$ cm$^{-3}$ or more in order to increase the absorption coefficient. In this case, the upper limit Mg dope amount for obtaining a practical electron hole concentration is, for example, $8*10^{19}$ cm$^{-3}$. Further, the second compound semiconductor layer may have a non-doped compound semiconductor layer and a p-type compound semiconductor layer from the active layer side. The distance from the active layer to the p-type compound semiconductor layer may be $1.2*10^{-7}$ m or less. By defining the distance from the active layer to the p-type compound semiconductor layer as above, internal loss is able to be inhibited in a range in which the internal quantum efficiency is not lowered. Thereby, the threshold current density at which laser oscillation is started is able to be decreased. The lower limit value of the distance from the active layer to the p-type compound semiconductor layer is not limited, but for example, the lower limit value is $5*10^{-8}$ m. Further, the laser diode device may have a ridge stripe structure. The width of a ridge section in the ridge stripe structure may be 2 µm or less. On both side faces of the ridge section, a laminated insulating film composed of $SiO_2$/Si laminated structure may be formed. The difference between the effective refractive index of the ridge section and the effective refractive index of the laminated insulating film may be from $5*10^{-3}$ to $1*10^{-2}$ both inclusive. By using such a laminated insulating film, even in the case of high output operation exceeding 100 mW, single fundamental transverse mode is able to be maintained. Though the lower limit value of the width of the ridge section is not limited, for example, the lower limit value is 0.8 µm. Further, the second compound semiconductor layer may have a structure in which a non-doped GaInN layer (p-side light guide layer), a non-doped AlGaN layer (p-side cladding layer), an Mg doped AlGaN layer (electron barrier layer), a superlattice structure (superlattice cladding layer) composed of a GaN layer (Mg doped)/AlGaN layer, and an Mg doped GaN layer (p-side contact layer) are layered. Further, a beam radiation half-value angle $\theta\perp$ in the vertical direction of laser light outputted from the end face of the laser diode device may be 25 deg or less, or preferably 21 deg or less. Though the lower limit value of the beam radiation half-value angle $\theta\perp$ is not limited, for example, the lower limit value is 17 deg. Further, as a resonant length, from 0.3 mm to 2 mm both inclusive is able to be exemplified. Further, the bandgap of compound semiconductor composing the well layer in the active layer is desirably 2.4 eV or more. Further, the wavelength of laser light outputted from the active layer is desirably from 360 nm to 500 nm both inclusive, and preferably from 400 nm to 410 nm both inclusive. It is needless to say that the foregoing various compositions are able to be combined as appropriate.

In the invention, various GaN compound semiconductor layers composing the laser diode device are sequentially formed over a substrate. Examples of the substrate include a GaAs substrate, a GaN substrate, an SiC substrate, an alumina substrate, a ZnS substrate, a ZnO substrate, an MN substrate, an LiMgO substrate, an $LiGaO_2$ substrate, an $MgAl_2O_4$ substrate, an InP substrate, an Si substrate, and a laminated body in which a foundation layer and a buffer layer are formed on the surface (main face) of the foregoing substrate in addition to a sapphire substrate. Further, examples of methods of forming the various GaN compound semiconductor layers composing the laser diode device include metal organic chemical vapor deposition method (MOCVD method and MOVPE method), molecular beam epitaxy method (MBE method), and hydride vapor growth method in which halogen contributes to transfer or reaction and the like.

Examples of organic gallium source gas in MOCVD method include trimethyl gallium (TMG) gas and triethyl gallium (TEG) gas. Examples of nitrogen source gas include ammonia gas and hydrazine gas. In forming the GaN compound semiconductor layer having n-type conductivity type, for example, silicon (Si) may be added as n-type impurity (n-type dopant). In forming the GaN compound semiconductor layer having p-type conductivity type, for example, magnesium (Mg) may be added as p-type impurity (p-type dopant). Further, in the case where aluminum (Al) or indium (In) is contained as a component atom of the GaN compound semiconductor layer, trimethyl aluminum (TMA) gas may be used as an Al source, and trimethyl indium (TMI) gas may be used as an In source. Further, monosilane gas ($SiH_4$ gas) may be used as an Si source, and ciclopentadienyl magnesium gas, methylciclopentadienyl magnesium, or bisciclopnetadienyl magnesium ($Cp_2Mg$) may be used as an Mg source. Examples of n-type impurity (n-type dopant) include Ge, Se, Sn, C, Te, SO, Pd, and Po in addition to Si. Examples of p-type impurity (p-type dopant) include Zn, Cd, Be, Ca, Ba, C, Hg, and Sr in addition to Mg.

The second electrode electrically connected to the second compound semiconductor layer having p-type conductivity type (or the second electrode formed on the contact layer) preferably has a single layer structure or a multilayer structure containing at least one metal selected from the group consisting of palladium (Pd), platinum (Pt), nickel (Ni), Al (aluminum), Ti (titanium), gold (Au), and silver (Ag), or a transparent conducive material such as ITO (Indium Tin Oxide) may be used therefor. Meanwhile, the first electrode electrically connected to the first compound semiconductor layer having n-type conductivity type desirably has a single layer structure or a multilayer structure containing at least one metal selected from the group consisting of gold (Au), silver (Ag), palladium (Pd), Al (aluminum), Ti (titanium), tungsten (W), Cu (copper), Zn (zinc), tin (Sn) and indium (In), and for example, Ti/Au, Ti/Al, and Ti/Pt/Au are able to be exemplified. The first electrode and the second electrode are able to be formed by PVD method such as vacuum evaporation method and sputtering method. The first electrode is electrically connected to the first compound semiconductor layer. The first electrode may be formed on the first compound semiconductor layer, and the first electrode may be connected to the first compound semiconductor layer with a conductive material layer or a conducive substrate in between. Similarly, the second electrode is electrically connected to the second compound semiconductor layer. The second electrode may be formed on the second compound semiconductor layer, and the second electrode may be connected to the second compound semiconductor layer with a conductive material layer in between.

A pad electrode may be provided on the first electrode and the second electrode in order to obtain electrical connection to an external electrode or a circuit. The pad electrode desirably has a single layer structure or a multilayer structure containing at least one metal selected from the group consisting of Ti (titanium), aluminum (Al), Pt (platinum), Au (gold), and Ni (nickel). Otherwise, the pad electrode may have a multilayer structure exemplified as a Ti/Pt/Au multilayer structure and a Ti/Au multilayer structure.

The invention is able to be applied to various fields such as the optical disc system, the communication field, the optical information field, the photoelectronic integration circuit, the field applying nonlinear optical phenomenon, the optical switch, the laser measurement field and various analysis fields, the ultrafast spectroscopy field, the multiphoton excitation spectroscopy field, the mass analysis field, the microspectroscopic field using multiphoton absorption, quantum control of chemical reaction, the nano three-dimensional processing field, various processing fields applying multiphoton absorption, the medical field, and the bio imaging field.

First Embodiment

The first embodiment relates to the method of driving a laser diode device and the laser diode equipment according to the first aspect and the second aspect of the invention, and further relates to the laser diode equipment according to the third aspect of the invention.

Figure 1B:
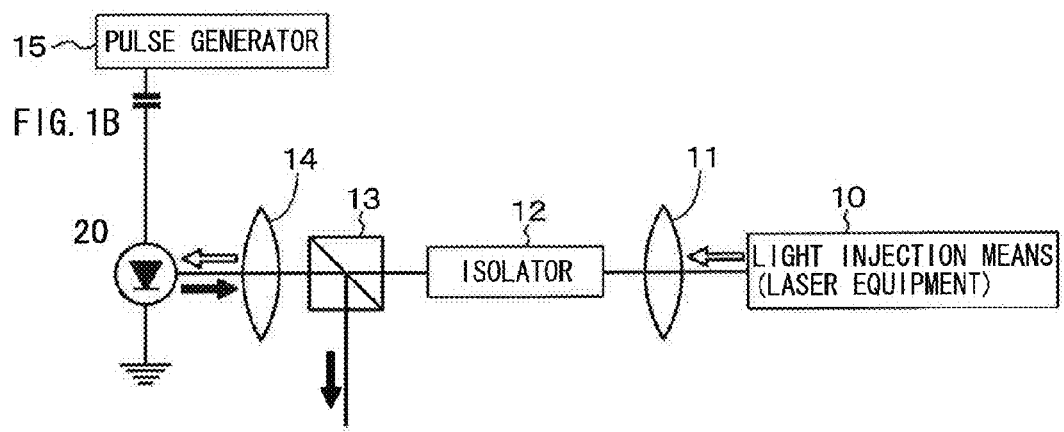

The laser diode equipment including an ultrashort pulse and ultrahigh power laser diode device of the first embodiment is composed of, as illustrated in FIG. 1A, a laser diode device 20 and a light injection means 10 for injecting light into the laser diode device 20 (in other words, for injecting carrier into the laser diode device 20). Further, the laser diode equipment includes a pulse generator 15. The laser diode device 20 is driven by a drive pulse from the pulse generator 15. Specifically, the laser diode equipment is composed of the GaN laser diode device 20 in light emitting wavelength band of 405 nm and the high output pulse generator 15 for making the GaN laser diode device 20 gain-switching operate. The laser diode equipment includes a direct current constant current power source 16. However, as illustrated in FIG. 1B, the laser diode equipment does not necessarily include the direct current constant current power source 16. The direct current constant current power source 16 is a known circuit component. As the pulse generator 15, a combination structure of a low voltage pulse generator and a high output voltage amplifier is able to be used.

Figure 3A:
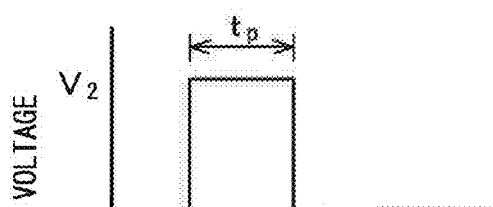
FIGS. 3A and 3B are diagrams schematically illustrating a rectangular pulse voltage applied to a laser diode device.

A voltage (drive pulse) applied to the laser diode device 20 is, as illustrated in FIG. 3A, a rectangular pulse voltage $V_2$ of a time width $t_p$. Since the direct current constant current power source 16 is included, the resultant value is obtained by adding the rectangular pulse voltage $V_2$ of the time width $t_p$ to a direct current voltage $V_1$. The direct current voltage $V_1$ is expressed by the following formula, where a current value supplied from the direct current constant current power source 16 is $I_1$, an internal resistance of the laser diode device 20 is R, and a built-in potential of p-n junction is $V_0$:

$$V_1 = R * I_1 + V_0 \sim V_0 = 3 \text{ Volt}$$

Figure 3B:
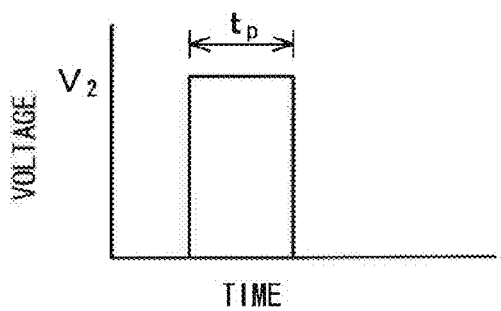

In this case, wiring resistance, contact resistance between a wiring and the laser diode device 20 and the like are ignored. In the circuit structure illustrated in FIG. 1B, as illustrated in FIG. 3B, a voltage applied to the laser diode device 20 is, as illustrated in FIG. 3B, the rectangular pulse $V_2$ of the time width $t_p$.

The laser diode device 20 is a laser diode device having a ridge stripe type separate confinement heterostructure (SCH structure). Specifically, the laser diode device 20 is a GaN laser diode device composed of an index guide type AlGaInN that has been developed for the Blu-ray optical disc system, and has a ridge stripe structure. The specifications thereof are as follows: optical output of the absolute maximum rating is 85 milliwatt at the time of continuous drive, and 170 milliwatt at the time of pulse drive (pulse width: 7.5 nanosecond, duty ratio: 50%); a standard value of light emitting wavelength is 405 nm; a threshold current value $I_t$, (standard value of an oscillation start current) is 40 milliampere; and standard values of a radiation angle in parallel with the active layer of laser light outputted from the end face of the laser diode device 20 (beam radiation half-value angle in the horizontal direction θ//) and a radiation angle perpendicular to the active layer of laser light outputted from the end face of the laser diode device 20 (beam radiation half-value angle in the vertical direction θ⊥) are respectively 8 degree and 21 degree. The laser diode device 20 is a laser diode device having high output specification with lowered light confinement in the lamination direction (vertical direction) of the after-mentioned compound semiconductor layer. Further, the resonant length is 0.8 mm.

Figure 4:
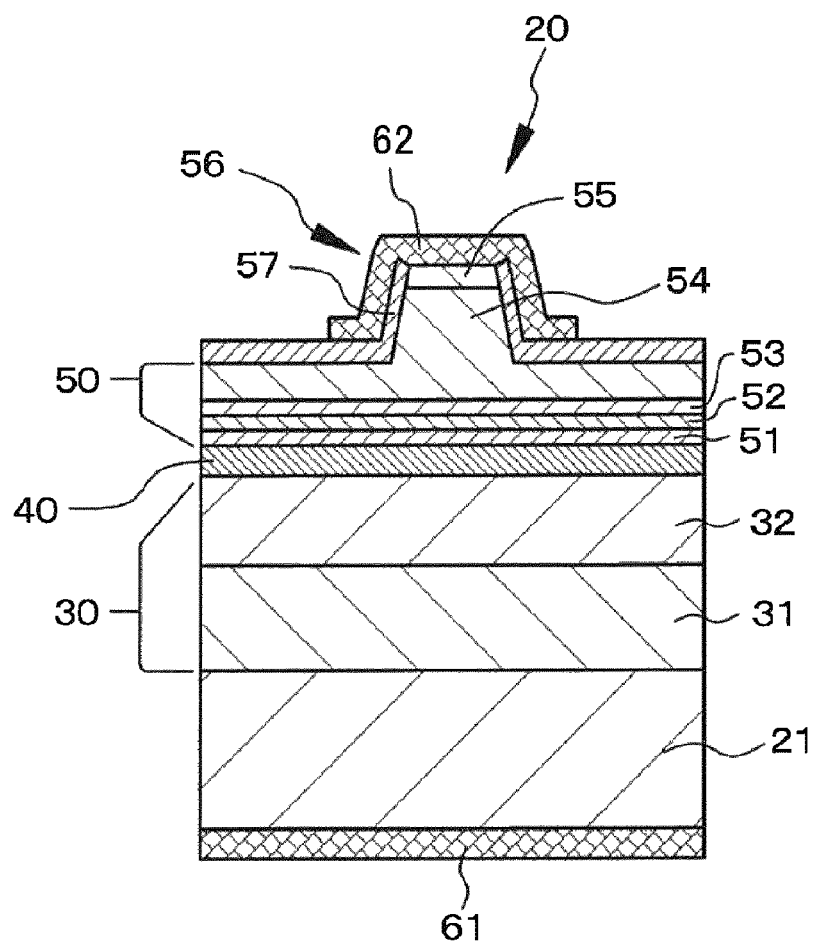
FIG. 4 is a schematic cross sectional view of a laser diode device of the first embodiment.
Figure 5A:
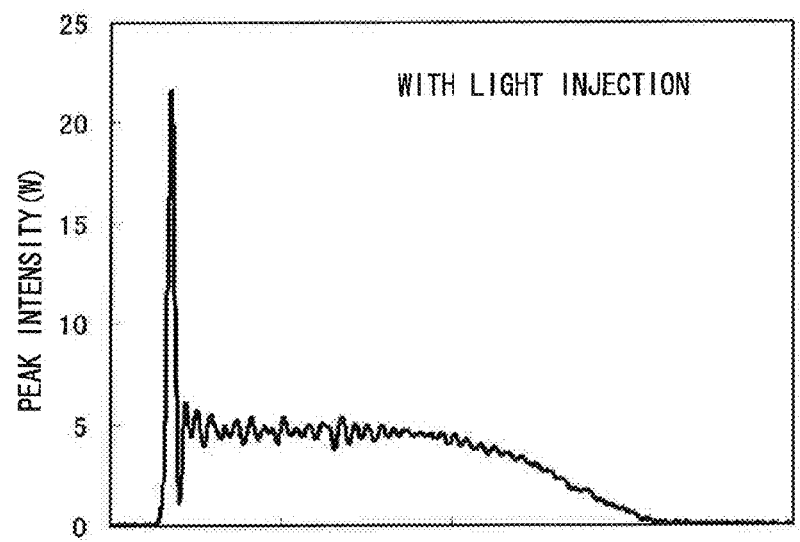
FIGS. 5A and 5B are graphs illustrating time change of a light waveform measured by a photodetector and a sampling oscilloscope in the first embodiment.
Figure 5B:
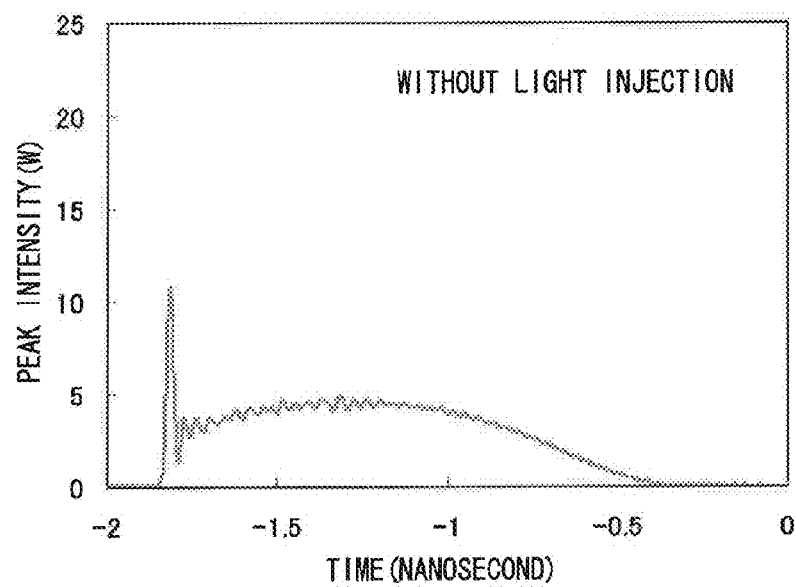
Figure 6A:
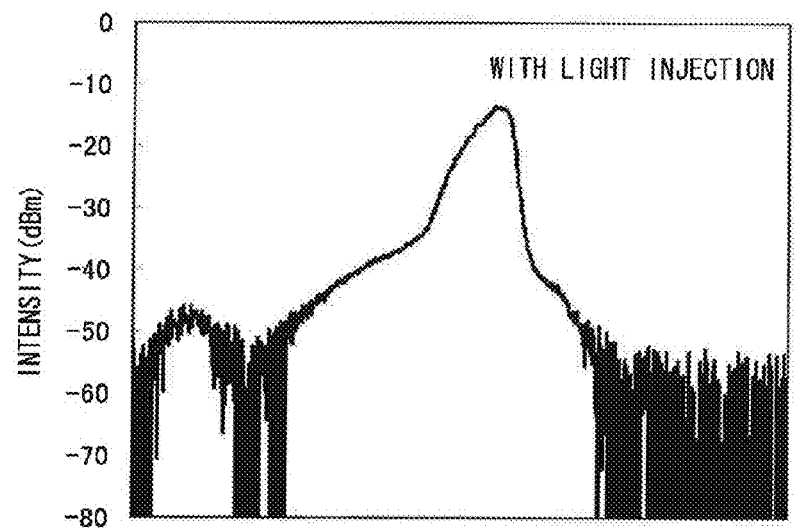
FIGS. 6A and 6B are graphs illustrating measurement results of light spectrum in the first embodiment.
Figure 6B:
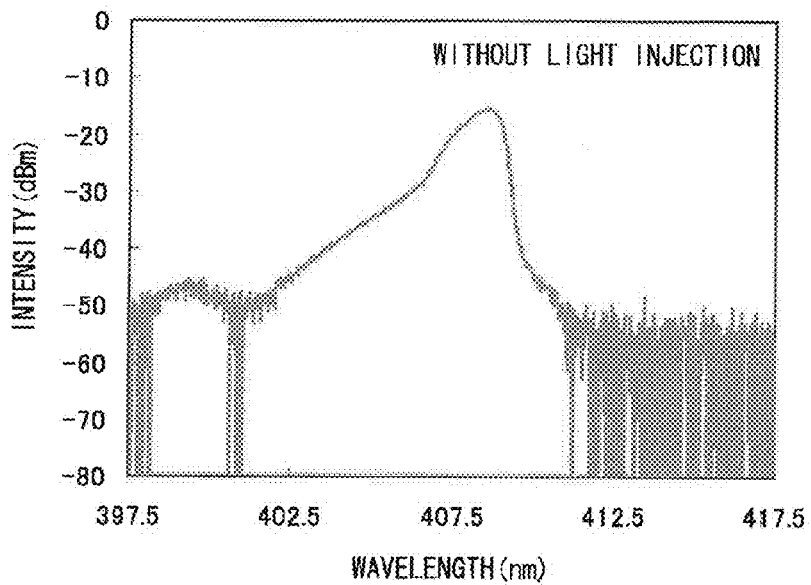
Figure 7A:
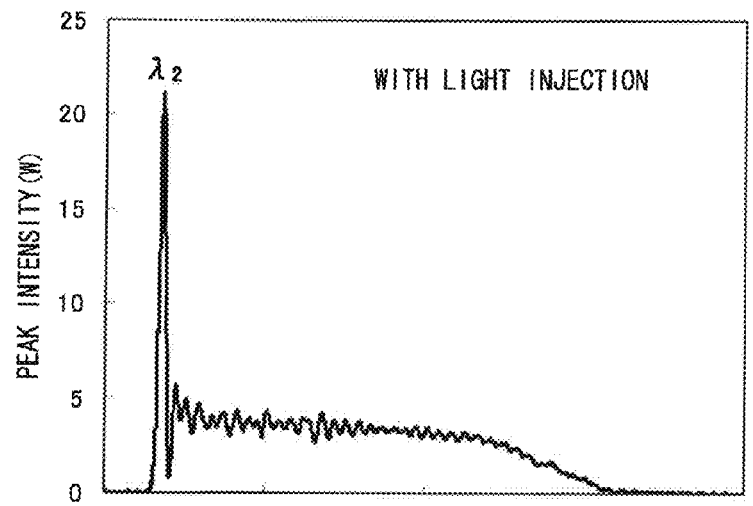
FIGS. 7A and 7B are graphs illustrating time change of a light waveform measured by a photodetector and a sampling oscilloscope in the first embodiment.
Figure 7B:
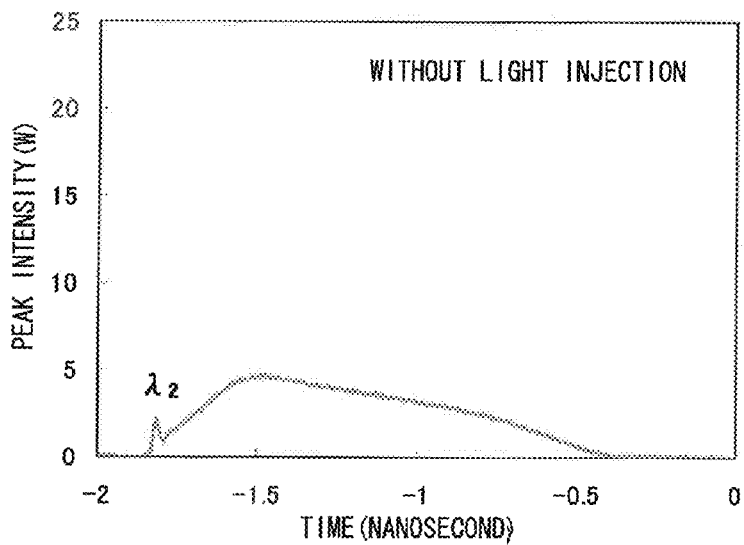
Figures 8A, 8B:
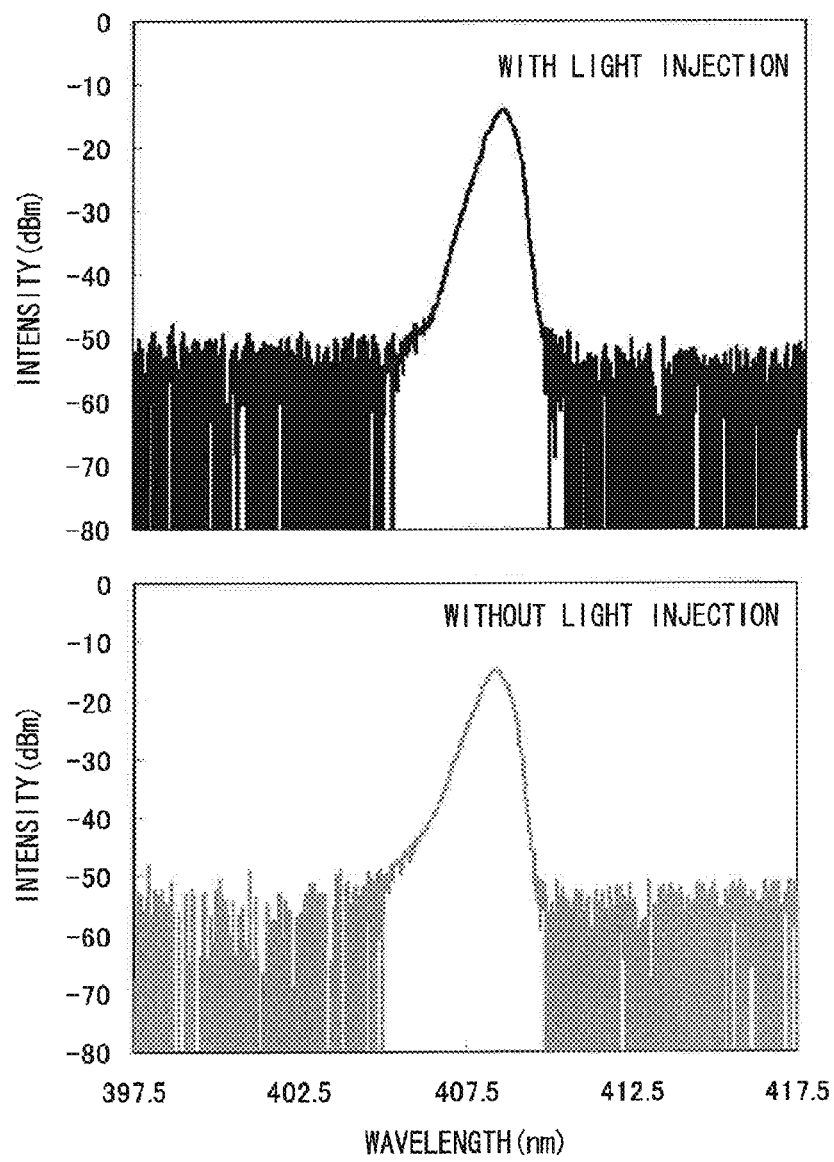
FIGS. 8A and 8B are graphs illustrating measurement results of light spectrum in the first embodiment.
Figure 9A:
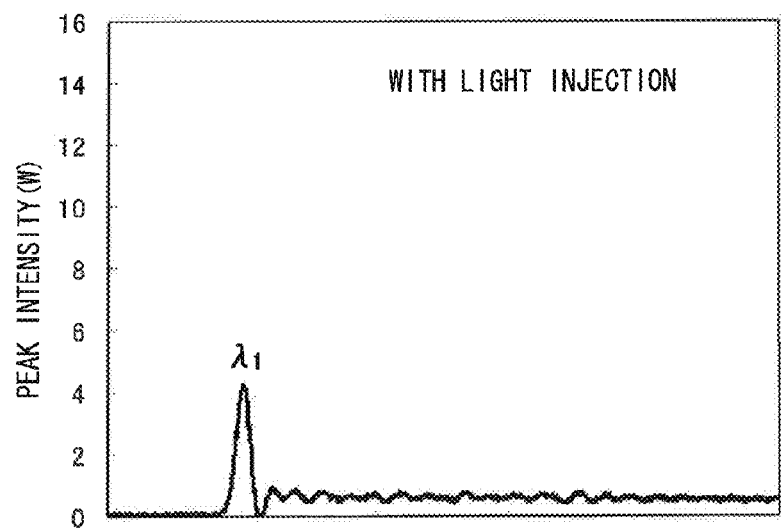
FIGS. 9A and 9B are graphs illustrating time change of a light waveform measured by a photodetector and a sampling oscilloscope in the first embodiment.
Figure 9B:
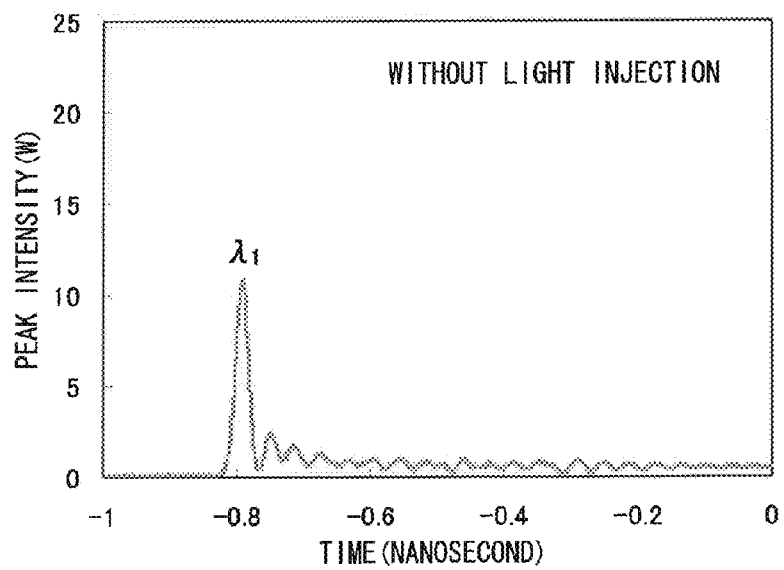
Figure 10A:
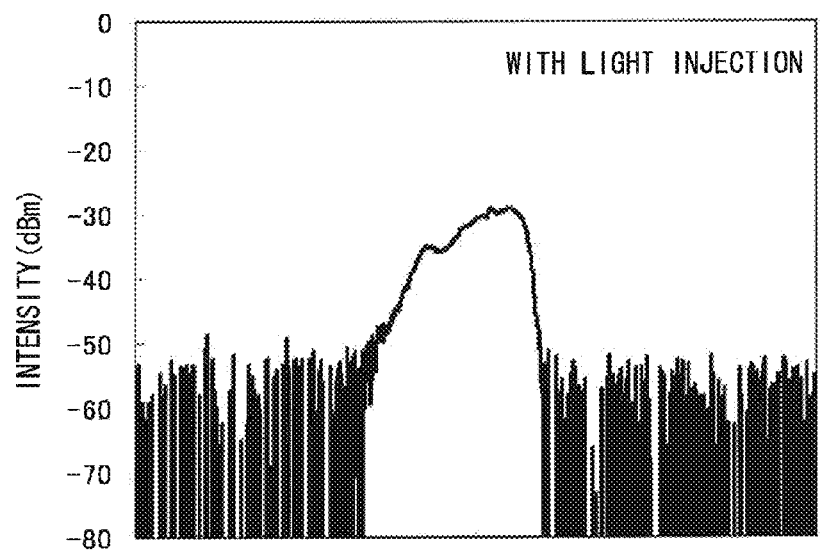
FIGS. 10A and 10B are graphs illustrating measurement results of light spectrum in the first embodiment.
Figure 10B:
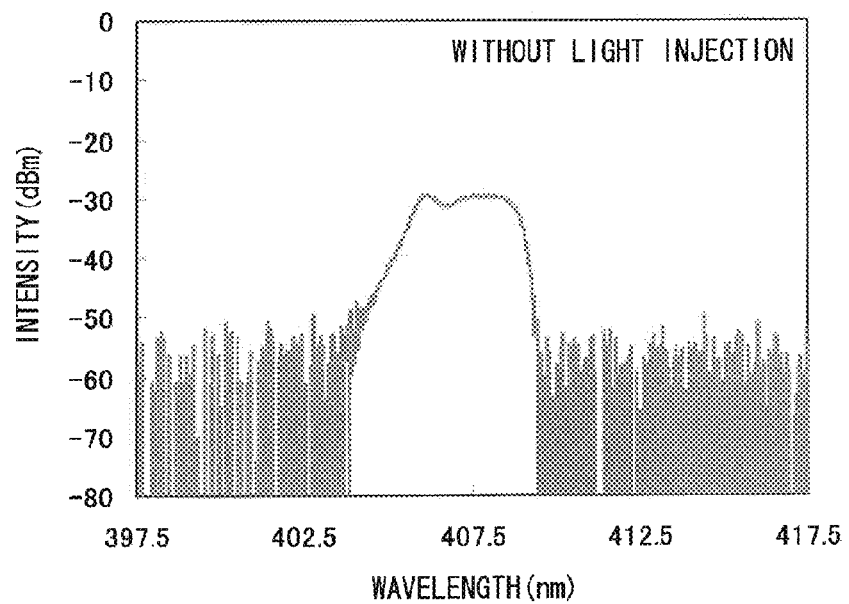

FIG. 4 illustrates a schematic cross sectional view of the laser diode device 20. The laser diode device 20 includes a laminated structure that is provided on (0001) plane of an n-type GaN substrate 21 and is composed of a first compound semiconductor layer 30, an active layer 40 having a quantum well structure, and a second compound semiconductor layer 50, a first electrode 61 electrically connected to the first compound semiconductor layer 30, and a second electrode 62 electrically connected to the second compound semiconductor layer 50. The first compound semiconductor layer 30, the active layer 40, and the second compound semiconductor layer 50 are composed of GaN compound semiconductor, specifically AlGaInN compound semiconductor. More specifically, the laser diode device 20 has a layer structure illustrated in the following Table 1. In Table 1, the listed items are shown in the order from the layer farthest from the n-type GaN substrate 21 to the layer closest to the n-type GaN substrate 21. The bandgap of compound semiconductor composing the well layer in the active layer 40 is 3.06 eV.

TABLE 1

Second compound semiconductor layer 50
p-type GaN contact layer (Mg doped) 55
p-type GaN (Mg doped)/AlGaN superlattice cladding layer 54
p-type AlGaN electron barrier layer (Mg doped) 53
non-doped AlGaN cladding layer 52
non-doped GaInN light guide layer 51
Active layer 40
GaInN quantum well active layer
(well layer: $Ga_{0.92}In_{0.08}N$/barrier layer: $Ga_{0.98}In_{0.02}N$)
First compound semiconductor layer 30
n-type GaN cladding layer 32
n-type AlGaN cladding layer 31

Further, part of the p-type GaN contact layer 55 and part of the p-type GaN/AlGaN superlattice cladding layer 54 are removed by RIE method, and a ridge section 56 having a width of 1.4 nm is formed. On both sides of the ridge section 56, an laminated insulating film 57 composed of $SiO_2$/Si is formed. The $SiO_2$ layer is the lower layer and the Si layer is the upper layer. The difference between the effective refractive index of the ridge section 56 and the effective refractive index of the laminated insulating film 57 is from $5*10^{-3}$ to $1*10^{-2}$ both inclusive, and specifically $7*10^{-3}$. On the p-type GaN contact layer 55 corresponding to the apex of the ridge section 56, the second electrode (p-type ohmic electrode) 62 composed of Pd/Pt/Au is formed. Meanwhile, on the rear face of the n-type GaN substrate 21, the first electrode (n-type ohmic electrode) 61 composed of Ti/Pt/Au is formed.

The thickness of the p-type GaN/AlGaN superlattice cladding layer 54 having a superlattice structure in which a p-type GaN layer and a p-type AlGaN layer are alternately layered is 0.7 μm or less, and specifically 0.4 μm. The thickness of the p-type GaN layer composing the superlattice structure is 2.5 nm. The thickness of the p-type AlGaN layer composing the superlattice structure is 2.5 nm. The total number of layers of the p-type GaN layer and the p-type AlGaN layer is 160. Further, the distance from the active layer 40 to the second electrode 62 is 1 μm or less, and specifically 0.5 μm. The height of the ridge section 56 is 0.3 μm. Further, the p-type AlGaN electron barrier layer 53, the p-type GaN/AlGaN superlattice cladding layer 54, and the p-type GaN contact layer 55 composing the second compound semiconductor layer 50 is doped with Mg at the level of $1*10^{19}$ $cm^{-3}$ or more (specifically at the level of $2*10^{19}$ $cm^{-3}$). The absorption coefficient of the second compound semiconductor layer 50 to light in wavelength of 405 nm is at least 50 $cm^{-1}$ and specifically 65 $cm^{-1}$. The second compound semiconductor layer 50 has the non-doped compound semiconductor layer (the non-doped GaInN light guide layer 51 and the non-doped AlGaN cladding layer 52) and the p-type compound semiconductor layer from the active layer side. A distance (d) from the active layer to the p-type compound semiconductor layer (specifically, p-type AlGaN electron barrier layer 53) is $1.2*10^{-7}$ m or less, and specifically 100 nm.

Figure 14:
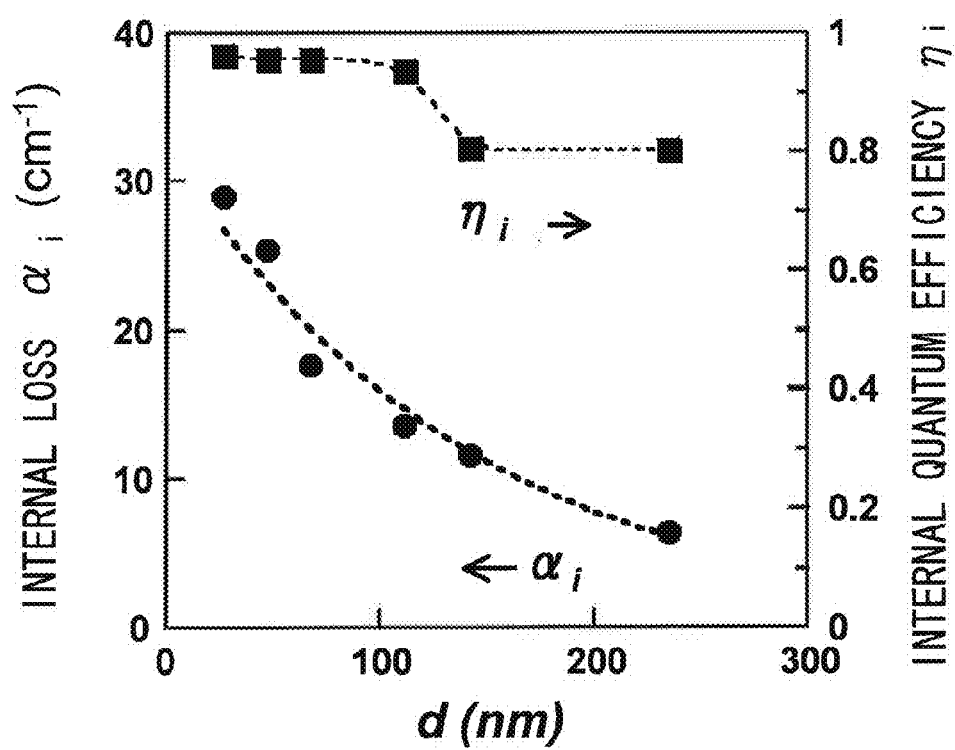
FIG. 14 is a graph illustrating a result of obtaining internal loss and internal quantum efficiency by forming a laser diode device in which a distance d from an active layer to a p-type AlGaN electron barrier layer is changed in the laser diode device of the first embodiment.

In the laser diode device 20 of the first embodiment, the p-type AlGaN electron barrier layer 53, the p-type GaN/AlGaN superlattice cladding layer 54, and the p-type GaN contact layer 55 as compound semiconductor layers doped with Mg are not overlapped with a density distribution of light generated from the active layer 40 and the vicinity thereof as much as possible. Thereby, internal loss is inhibited in a range in which the internal quantum efficiency is not lowered. Thereby, the threshold current density at which laser oscillation is started is decreased. FIG. 14 illustrates a result obtaining internal loss $\alpha_i$ and an internal quantum efficiency $\eta_i$ by practically forming a laser diode device in which the distance d from the active layer 40 to the p-type AlGaN electron barrier layer 53 is changed. FIG. 14 shows the following. That is, if the value d is increased, the internal loss $\alpha_i$ is lowered. If the value d reaches or exceeds a certain value, efficiency of hole injection into the well layer is lowered. In result, recombination probability of electron hole in the active layer is lowered, and the internal quantum efficiency $\eta_i$ is decreased. Based on the foregoing result, the value d is designed as the foregoing description.

The laser diode device 20 of the first embodiment or the laser diode device composing the laser diode equipment of the first embodiment is driven by a pulse current having a value 10 or more times as large as the threshold current value $I_{th}$, preferably 20 or more times as large as the threshold current value $I_{th}$, and more preferably 50 or more times as large as the threshold current value $I_{th}$. The current value is a value significantly exceeding a current value (rated current) necessary for obtaining a rated light output. Otherwise, in the method of driving a laser diode device of the first embodiment, the laser diode is driven by a pulse voltage having a value twice or more as large as the threshold voltage value $V_{th}$, preferably 4 or more times as large as the threshold voltage value $V_{th}$, and more preferably 10 or more times as large as the threshold voltage value $V_{th}$. Further, the laser diode device 20 is driven by a voltage increased up to a level equal to or more than a voltage inducing transverse mode instability. Further, the laser diode device 20 of the first embodiment or the laser diode device 20 composing the laser diode equipment of the first embodiment is driven by a pulse current having a value 10 or more times as large as the threshold current value $I_{th}$, preferably 20 or more times as large as the threshold current value $I_{th}$, and more preferably 50 or more times as large as the threshold current value $I_{th}$, and is driven by a pulse current significantly exceeding the rated current. Otherwise, the laser diode device 20 of the first embodiment or the laser diode device 20 composing the laser diode equipment of the first embodiment is driven by a pulse voltage having a value twice or more as large as the threshold voltage value $V_{th}$, preferably 4 or more times as large as the threshold voltage value $V_{th}$, and more preferably 10 or more times as large as the threshold voltage value $V_{th}$, and is driven by a voltage increased up to a level equal to or more than a voltage inducing transverse mode instability. Otherwise, the laser diode device 20 of the first embodiment or the laser diode device 20 composing the laser diode equipment of the first embodiment outputs a first light peak in which the light intensity is 3 watt or more, preferably 5 watt or more, and much more preferably 10 watt or more, and the half bandwidth is 20 picosecond or less, preferably 15 picosecond or less, and more preferably 10 picosecond or less, and outputs a second light peak in which energy is 1 nano Joule or more, preferably 2 nano Joule or more, and more preferably 5 nano Joule or more, and the duration time is 1 nanosecond or more, preferably 2 nanosecond or more, and more preferably 5 nanosecond or more following the first light peak.

When the pulse voltage illustrated in FIG. 3A was applied, light waveforms illustrated in FIGS. 15A to 15D from the laser diode device 20 of the first embodiment were observed by using a photodetector and a sampling oscilloscope. Specifications of the applied pulse voltage are as illustrated in Table 2. The vertical axis in FIGS. 15A to 15D represents a signal voltage obtained by the photodetector, and an output signal of 500 millivolt corresponds to light output of 10 watt.

Figure 15B:
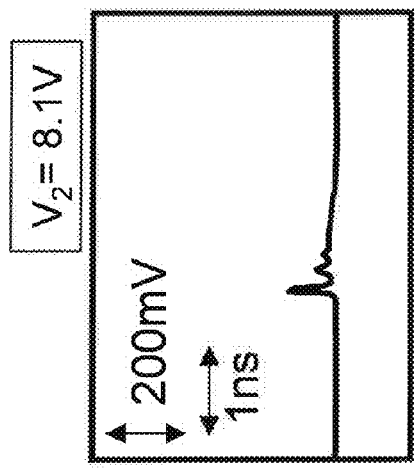
FIGS. 15A to 15D are diagrams illustrating waveforms of laser light outputted from the laser diode device of the first embodiment.
Figure 15D:
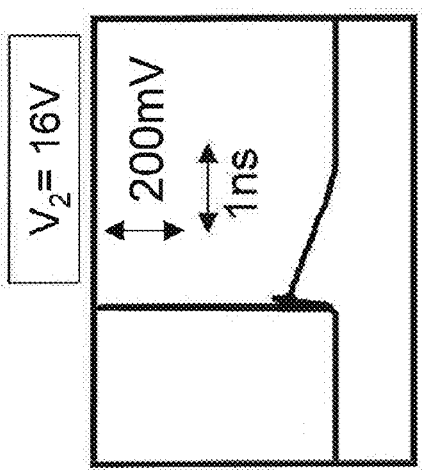
Figure 15A:
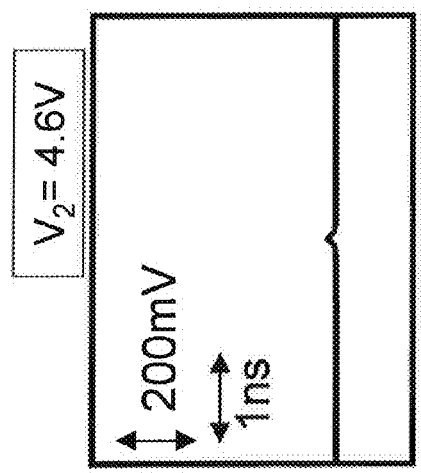
Figure 15C:
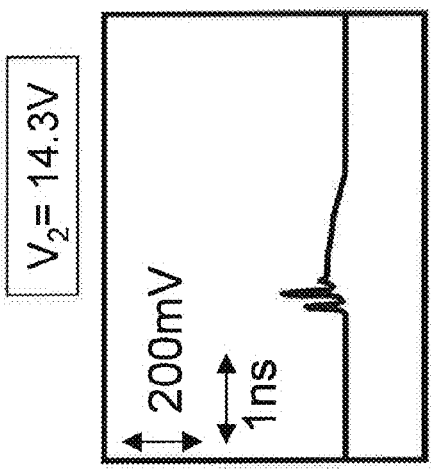

TABLE 2 direct current constant current $I_1$: 0.1 milliampere
pulse width $t_p$: 2 nanosecond
pulse repetition frequency f: 100 kHz As illustrated in FIG. 15A, when the pulse voltage $V_2$ was 4.6 volt, a single light peak was obtained. Further, as illustrated in FIG. 15B, when the pulse voltage $V_2$ was 8.1 volt, a plurality of light pulses resulting from relaxation oscillation of the laser diode device were shown. Further, as illustrated in FIG. 15C, as the pulse voltage $V_2$ was increased, when the pulse voltage $V_2$ was 14.3 volt, after a plurality of acute light pulses with a half bandwidth of 50 picosecond or less were generated, a wide light pulse with duration time of about 1 nanosecond was overlapped therewith.

Further, when the pulse voltage $V_2$ was 16 volt, as illustrated in FIG. 15D, an acute single light pulse with a half bandwidth of 20 picosecond or less having high peak energy (about 10 watt) (Giant Pulse, referred to as GP, corresponding to the first light peak) was shown. Following the first light peak, it was observed that a plurality of light pulses with low intensity and a wide light peak with duration time of 1 nanosecond or more (second light peak with duration time of about 1.5 nanosecond) were overlapped. The pulse current value at this time was 0.4 ampere or more, and specifically 1.6 ampere. Otherwise, in the case where the value of the pulse current is converted to a value per 1 cm$^2$ of the active layer (a value per 1 cm$^2$ of a joint region area), that is, in the case where the value of the pulse current is converted to a current density (operation current density:unit of ampere/cm$^2$), the value was $1.4*10^5$ ampere/cm$^2$. The first light peak (GP) is shown by making the GaN laser diode device gain-switching operate, which is considered as a specific phenomenon. A similar experiment was performed for a GaAs high output laser diode device. However, a light pulse with a high pointed value such as the first light peak shown in the laser diode device 20 of the first embodiment was not observed.

Figure 16B:
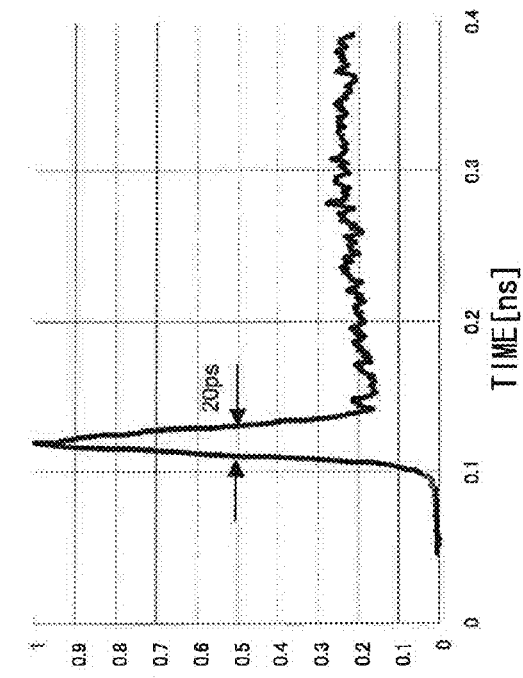
FIG. 16A is a diagram illustrating a typical example illustrating a light waveform measured by a photodetector and a sampling oscilloscope and a shown first light peak (GP) in the laser diode device of the first embodiment, and FIG. B is a diagram illustrating a result of measuring a half bandwidth of the first light peak (GP) by a streak camera.
Figure 16A:
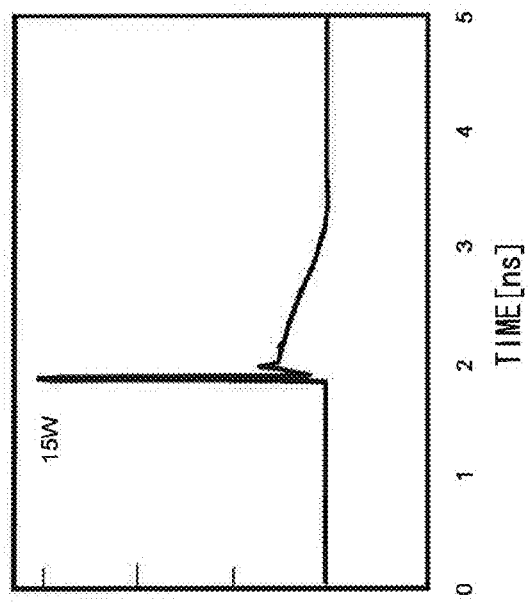

FIG. 16A illustrates a typical example of a light waveform measured by the photodetector and the sampling oscilloscope and the shown first light peak (GP). The first light peak (GP) having high peak light intensity of 15 watt and the second light peak having energy of 1 nano Jour or more, and specifically 1.1 nano Jour with duration time of 1 nanosecond or more, and specifically 1.5 nanosecond following the first light peak were shown. At this time, the drive conditions were as illustrated in Table 3. In the case where the half bandwidth of the first light peak (GP) was measured by a streak camera, the result was significantly narrow value, 20 picosecond (refer to FIG. 16B).

TABLE 3 direct current constant current $I_1$: 0.1 milliampere
pulse width $t_p$: 2 nanosecond
pulse repetition frequency f: 100 kHz
pulse voltage $V_2$: 45 volt The laser diode device 20 of the first embodiment has energy storage mechanism resulting from transverse mode instability. Thereby, the laser diode device 20 executes Q switching laser operation that generates the first light peak (GP). In other words, the laser diode device of the first embodiment is able to be referred to as a gain switching type laser diode device that internally includes the Q switching laser function since the laser diode device has the energy storage mechanism resulting from transverse mode instability. Further, due to the Q switching mechanism effectively and internally included in the laser diode device associated with increased current pulse, a short light pulse width of 20 picosecond or less and a peak light output of 3 watt or more (for example, 10 watt or more) that have not been known in the existing gain switching type laser diode device are able to be obtained.

As described above, in the first embodiment, the laser diode device 20 is driven by the pulse current having a value 10 or more times as large as the threshold current value $I_{th}$, or the laser diode device 20 is driven by the pulse voltage having a value twice or more as large as the threshold voltage value $V_{th}$. In result, an ultrashort pulse and ultrahigh power laser diode device that outputs laser light having a pointed peak in which the light intensity is 3 watt or more, and the half bandwidth is 20 picosecond or less is able to be obtained. Further, in the laser diode device of the first embodiment, a laser diode device that outputs laser light having a pointed peak in which the light intensity is 3 watt or more, and the half bandwidth is 20 picosecond or less as the first light peak (GP), and outputs the second light peak in which energy is 1 nano Joule or more, and the duration time is 1 nanosecond or more as a broad peak having high energy following the first light peak (GP) is able to be obtained.

In the first embodiment, light is injected from the light injection means 10 into the laser diode device 20 driven as above (that is, the laser diode device 20 performing strong excitation gain switching operation). That is, carrier is injected from the light injection means 10 into the laser diode device 20.

The light injection means 10 is composed of a laser equipment, and specifically a continuous oscillation type laser equipment (more specifically a GaN laser diode device) outputting laser light in a wavelength ($\lambda_2$) of 408.9 nm. Laser light continuously outputted from the light injection means 10 is injected (radiated) into (to) the laser diode device 20 through a collecting lens 11, an isolator 12, a beam splitter 13, and a collecting lens 14. Meanwhile, the laser light outputted from the laser diode device 20 enters the beam splitter 13 through the collecting lens 14, and is outputted in a direction different from the light injection means 10.

The laser diode device 20 is driven in a state that light is injected into the laser diode device 20 by the continuous oscillation type laser equipment. Specifically, the laser diode device 20 was driven under the conditions in the following Table 4.

TABLE 4 pulse width $t_p$: 2 nanosecond
pulse repetition frequency f: 20 MHz
pulse voltage $V_2$: 40 volt FIGS. 5A, 5B, FIGS. 7A, 7B, and FIGS. 9A, 9B illustrate time change of a light waveform measured by the photodetector and the sampling oscilloscope. FIGS. 6A, 6B, FIGS. 8A, 8B, and FIGS. 10A, 10B illustrate measurement results of light spectrum. The graphs illustrated in FIG. 5A, FIG. 6A, FIG. 7A, FIG. 8A, FIG. 9A, and FIG. 10A are obtained in a state that light injection is made. Meanwhile, the graphs illustrated in FIG. 5B, FIG. 6B, FIG. 7B, FIG. 8B, FIG. 9B, and FIG. 10B are obtained in a state that light injection is not made.

Further, the graphs illustrated in FIGS. 5A, 5B and FIGS. 6A, 6B are graphs illustrating time change of a light waveform in all spectrum components and all light spectrum. Meanwhile, the graphs illustrated in FIGS. 7A, 7B and FIGS. 8A, 8B are graphs illustrating time change of a light waveform in the spectrum component obtained by extracting a wavelength component in the vicinity of the wavelength $\lambda_2$ of light from the light injection means 10 by using a band pass filter and light spectrum. Further, the graphs illustrated in FIGS. 9A, 9B and FIGS. 10A, 10B are graphs illustrating time change of a light waveform in the spectrum component obtained by extracting a wavelength component in the vicinity of the wavelength $\lambda_1$ (wavelength of the first light peak outputted from the laser diode device 20 in a state that light is not injected from the light injection means 10, and the value is 406.2 nm) by using a band pass filter and light spectrum.

Figure 11:
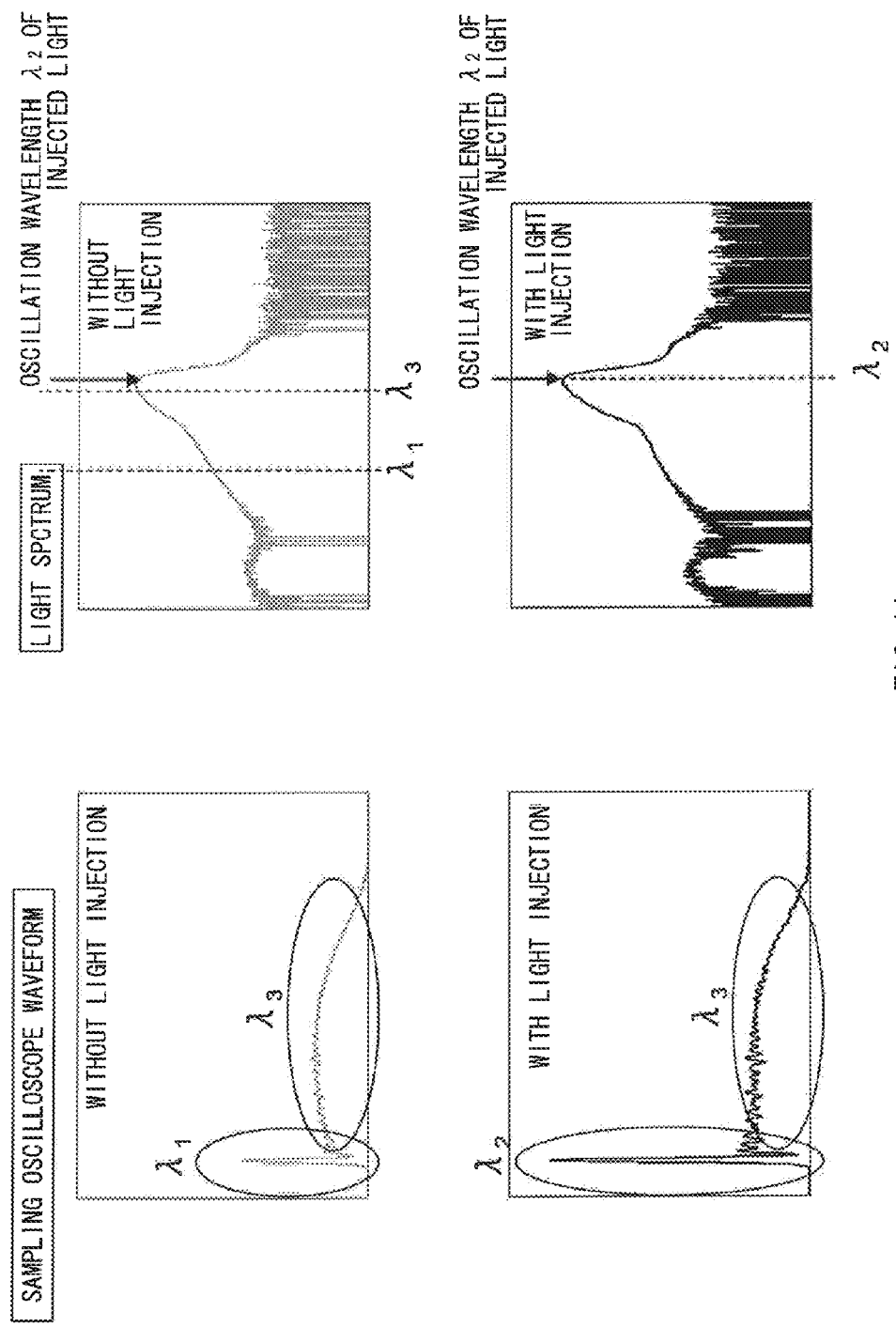
FIG. 11 is a conceptual diagram for explaining a relation between oscillation wavelength of injected light and light time waveform/light spectrum change.

Further, FIG. 11 illustrates a conceptual diagram of a relation between oscillation wavelength of injected light and light time waveform/light spectrum change. The main light wavelength $\lambda_3$ is a peak wavelength of light spectrum widen by gain switching operation (peak wavelength of oscillation wavelength in total time waveform), and specifically 408.5 nm (refer to the peak wavelength of FIG. 6B).

As evidenced by FIG. 9B, FIG. 10B, FIG. 9A, and FIG. 10A, it is found that the light intensity in the vicinity of the wavelength $\lambda_1$ is more decreased in the state that light is injected than in the state that light is not injected, and due to the light injection, the wavelength of the first light peak outputted from the laser diode device 20 is changed from $\lambda_1$ to other wavelength. Meanwhile, as evidenced by FIG. 7B, FIG. 8B, FIG. 7A, and FIG. 8A, it is found that the light intensity in the vicinity of the wavelength $\lambda_2$ is more drastically increased in the state that light is injected than in the state that light is not injected, and due to the light injection, the wavelength of the first light peak outputted from the laser diode device 20 is changed to $\lambda_2$. That is, it is found that due to the light injection, the wavelength of the first light peak outputted from the laser diode device 20 is shifted from $\lambda_1$ to $\lambda_2$. Further, from the graphs illustrating time change of a light waveform in all spectrum components in the state that light is injected and the all light spectrum (refer to FIGS. 5A, 5B and FIGS. 6A, 6B), it is found that due to the light injection, oscillation in the main light wavelength $\lambda_3$ is shifted to the oscillation wavelength ($\lambda_2$), the main oscillation wavelength ($\lambda_3$) in the gain switching operation is drawn into the wavelength component ($\lambda_2$) of injected light, peak power of the main peak of the laser diode device 20 is largely intensified. In other words, light intensity of apparent pulse laser light outputted from the light injection means 10 is largely intensified. $\lambda_2$ and $\lambda_3$ satisfy the following relation:

$$0.98 \leq \lambda_2/\lambda_3 \leq 1.02$$

Second Embodiment

Figure 2:
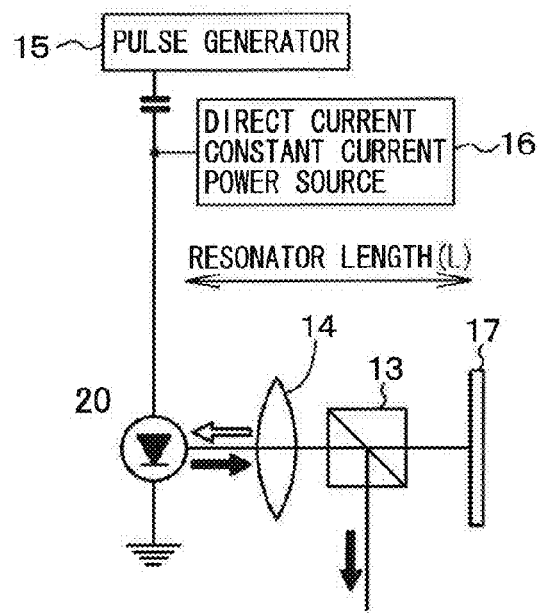
FIG. 2 is a circuit diagram of a laser diode equipment of a second embodiment.

The second embodiment is a modified embodiment of the first embodiment. In the laser diode equipment including an ultrashort pulse and ultrahigh power laser diode device of the second embodiment, a light injection means is composed of, as illustrated in FIG. 2, an external resonator, and specifically an external mirror 17. In the example illustrated in Table 2, the laser diode equipment includes the direct current constant current power source 16. However, as illustrated in FIG. 1B, the laser diode equipment does not necessarily include the direct current constant current power source 16 as well. Laser light outputted from the laser diode device 20 is transmitted through the collecting lens 14. Further, part of the laser light is transmitted through the beam splitter 13, is reflected by the external mirror 17, and is returned to the laser diode device 20 through the beam splitter 13 and the collecting lens 14. Further, the other part of the laser light outputted from the laser diode device 20 is transmitted through the collecting lens 14, and is extracted outside from the beam splitter 13.

Figure 12A:
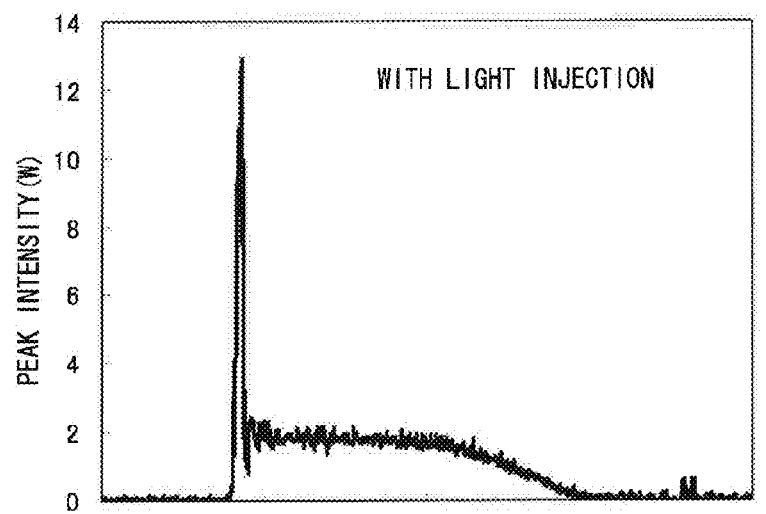
FIGS. 12A and 12B are graphs illustrating time change of a light waveform measured by a photodetector and a sampling oscilloscope in the second embodiment.
Figure 12B:
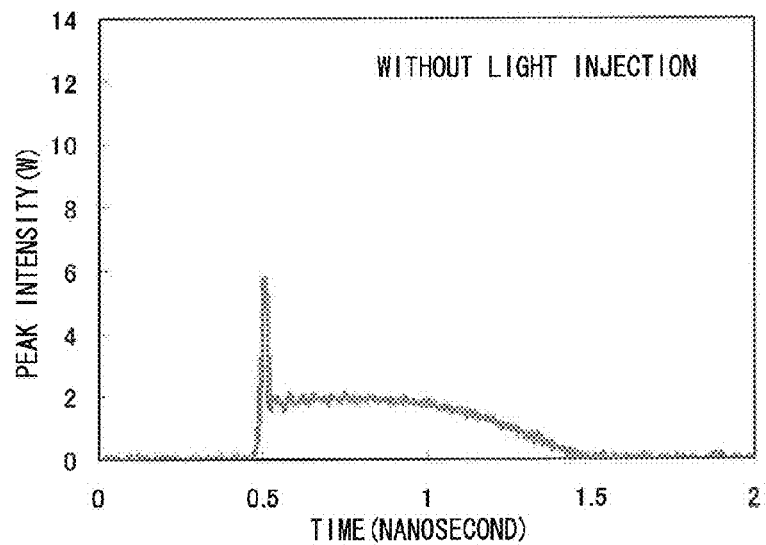
Figure 13A:
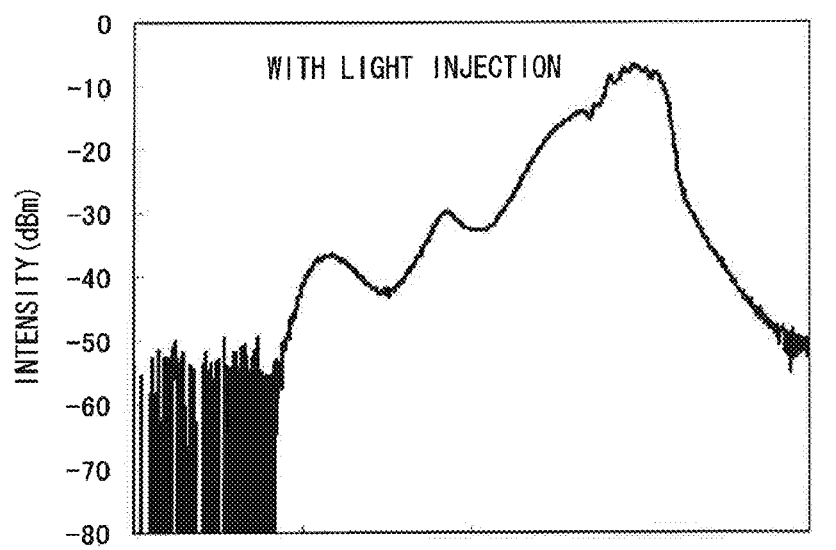
FIGS. 13A and 13B are graphs illustrating measurement results of light spectrum in the second embodiment.
Figure 13B:
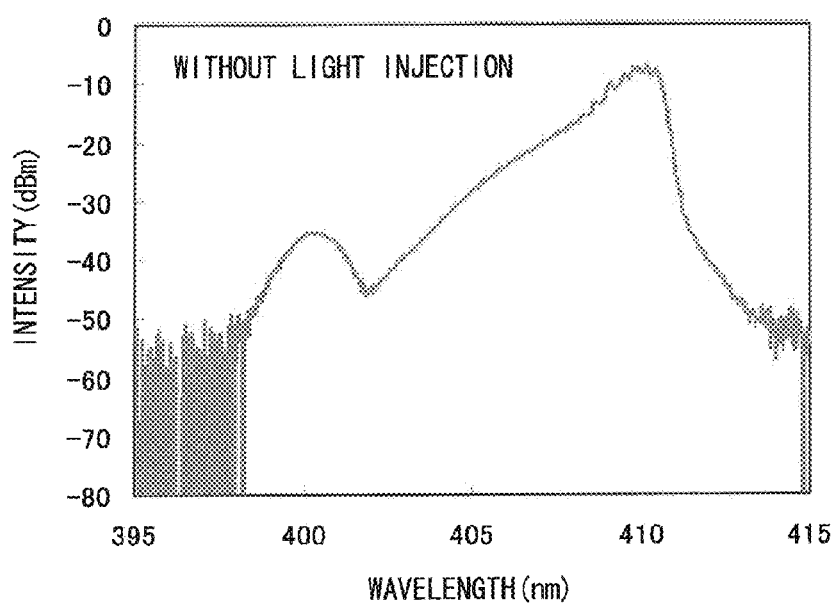

FIGS. 12A and 12B illustrate time change of a light waveform measured by a photodetector and a sampling oscilloscope. FIGS. 13A and 13B illustrate measurement results of light spectrum. The graphs illustrated in FIG. 12A and FIG. 13A are obtained in a state that light injection is made. Meanwhile, the graphs illustrated in FIG. 12B and FIG. 13B are obtained in a state that light injection is not made. Further, the graphs illustrated in FIGS. 12A and 12B and FIGS. 13A and 13B are graphs illustrating time change of a light waveform in all spectrum components and all light spectrum.

In the second embodiment, relation between the repetition frequency $f_1$ of a short pulse current applied to the laser diode device 20 and the beat frequency $f_2$ of the external resonator (specifically, the external mirror 17) satisfies the following formula:

$$0.99 \leq f_2/f_1 \leq 1.01$$

$f_1$ and $f_1$ are specifically expressed by the following values:

$$f_1 = 100.0 * 10^6 \text{ Hz}$$

$$f_2 = 100.7 * 10^6 \text{ Hz}$$

From the foregoing graphs, it is found that the first light peak oscillated in the wavelength $\lambda_1$ in the laser diode device 20 is shifted to the oscillation wavelength ($\lambda_2$) of injected light due to light injection, the main oscillation wavelength ($\lambda_3$) in the gain switching operation is drawn into the wavelength component ($\lambda_2$) of injected light, and peak power of the main peak of the laser diode device 20 is largely intensified. That is, it is found that due to presence of the external resonator (presence of feed back), the peak power of the main peak of the laser diode device 20 is intensified.

Descriptions have been hereinbefore given of the invention with reference to the preferred embodiments. However, the invention is not limited to the foregoing embodiments. The composition and the structure of the laser diode device and the composition of the laser diode equipment described in the embodiments are just exemplified, and modifications may be made as appropriate. Further, in the embodiments, though various values have been shown, such various values are just exemplified as well, and thus it is needless to say that, for example, if specifications of a laser diode device to be used are changed, values are also changed. In the case where the oscillation wavelength ($\lambda_2$) of injected light is in the vicinity of the oscillation wavelength ($\lambda_1$) of the first light peak, specifically, in the case where value $|\lambda_2-\lambda_1|$ is within +/−2%, and preferably within +/−1%, in some cases, light intensity of the first light peak is effectively intensified without generating wavelength shift in the first light peak.

The present application contains subject matter related to that disclosed in Japanese Priority Patent Application JP 2009-047617 filed in the Japan Patent Office on Mar. 2, 2009, the entire contents of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A method of driving a laser diode device, the method comprising the steps of:
   generating light with a light source;
   driving a GaN laser diode with a pulse current have an amperage that is 10 or more times greater than a turn on threshold amperage for the GaN laser diode; and
   injecting the light into the laser diode.

2. The method of driving a laser diode device according to claim 1, wherein a width of the pulse current is 10 nanosecond or less.

3. The method of driving a laser diode device according to claim 1, wherein the amperage of the pulse current is 0.4 ampere or more.

4. The method of driving a laser diode device according to claim 1, wherein in a state that light is not injected into the GaN laser diode, where a wavelength of main light outputted output from the GaN laser diode is $\lambda_3$, and a wavelength of light from the light source is $\lambda_2$, the following relationship exists:

$$0.98 \leq \lambda_2/\lambda_3 \leq 1.02.$$

5. The method of driving a laser diode device according to claim 1, wherein the light source comprises a laser.

6. The method of driving a laser diode device according to claim 1, wherein the light source comprises an external mirror that reflects laser light output from the GaN laser diode device.

7. The method of driving a laser diode device according to claim 6, wherein where a beat frequency of the external mirror is $f_1$, and a repetition frequency of a pulse voltage or a pulse current applied to the GaN laser diode is $f_2$, the following relationship exists:

$$0.99 \leq f_2/f_1 \leq 1.01.$$

8. A method of driving a laser diode device, the method comprising the steps of:
   generating light with a light source;
   driving a GaN laser diode with a pulse voltage have a voltage that is 2 or more times greater than a turn on threshold voltage for the GaN laser diode; and
   injecting the light into the laser diode.

9. The method of driving a laser diode device according to claim 8, wherein a width of the pulse voltage is 10 nanosecond or less.

10. The method of driving a laser diode device according to claim 8, wherein the voltage of the pulse voltage is 8 volts or more.

11. The method of driving a laser diode device according to claim 8, wherein in a state that light is not injected into the GaN laser diode, where a wavelength of main light output by the GaN laser diode is $\lambda 3$, and a wavelength of the light from the light source is $\lambda 2$, the following relationship exists:

$$0.98 \leq \lambda 2/\lambda 3 \leq 1.02.$$

12. The method of driving a laser diode device according to claim 8, wherein the light source is a laser.

13. The method of driving a laser diode device according to claim 8, wherein the light injection means comprises an external mirror that reflects laser light output by the GaN laser diode.

14. The method of driving a laser diode device according to claim 13, wherein where a beat frequency of the external mirror is f1, and a repetition frequency of a pulse voltage or a pulse current applied to the laser diode device is f2, the following relationship exists:

$$0.99 \leq f2/f1 \leq 1.01.$$

* * * * *